United States Patent [19]
Dando

[11] Patent Number: 5,863,813
[45] Date of Patent: Jan. 26, 1999

[54] METHOD OF PROCESSING SEMICONDUCTIVE MATERIAL WAFERS AND METHOD OF FORMING FLIP CHIPS AND SEMICONDUCTOR CHIPS

[75] Inventor: Ross S. Dando, Nampa, Id.

[73] Assignee: Micron Communications, Inc., Boise, Id.

[21] Appl. No.: 917,004

[22] Filed: Aug. 20, 1997

[51] Int. Cl.$^6$ ............................ H01L 21/44; H01L 21/48; H01L 21/50
[52] U.S. Cl. ............................ 438/114; 438/106; 438/128
[58] Field of Search ..................................... 438/114, 106, 438/128

[56] References Cited

U.S. PATENT DOCUMENTS

| | | | |
|---|---|---|---|
| 5,169,804 | 12/1992 | Schwartzbauer | 438/114 |
| 5,455,455 | 10/1995 | Badehi | 438/114 |
| 5,501,104 | 3/1996 | Ikeda et al. | 438/114 |

*Primary Examiner*—Kevin M. Picardat
*Assistant Examiner*—Deven Collins
*Attorney, Agent, or Firm*—Wells, St. John, Roberts, Gregory & Matkin, P.S.

[57] ABSTRACT

A method of processing a semiconductive material wafer includes, a) providing a semiconductive material wafer having integrated circuitry fabricated within discrete die areas on the wafer, the discrete die areas having bond pads formed therewithin; b) cutting at least partially into the semiconductive material wafer about the die areas to form a series of die cuts, the cuts having edges; c) depositing an insulative material over the wafer and to within the cuts to at least partially cover the cut edges and to at least partially fill the cuts with the insulative material; d) removing the insulative material from being received over the bond pads and leaving the insulative material within the die cuts; and e) after the removing, cutting into and through the insulative material within the die cuts and through the wafer. A semiconductor chip includes an outer surface having conductive bond pads proximately associated therewith. Side edges extend from the outer surface. An insulating material layer is adhered to at least a portion of the side edges and not formed over the bond pads. The insulative material layer can be continuous and adhered to only a portion of the outer surface and adhered to at least a portion of the side edges. The insulative material preferably has a thickness of between 100 Angstroms and 100 microns.

35 Claims, 8 Drawing Sheets

METHOD OF PROCESSING SEMICONDUCTIVE MATERIAL WAFERS AND METHOD OF FORMING FLIP CHIPS AND SEMICONDUCTOR CHIPS

TECHNICAL FIELD

This invention relates to methods of processing semiconductive material wafers, to methods of forming flip chips, and to semiconductor chips, and to such products themselves independent of processing method.

BACKGROUND OF THE INVENTION

Most semiconductor wafer processing fabricates multiple different areas on a wafer into identical circuitry which are subsequently cut from the wafer into individual chips or die. These are then fabricated into finished packages. One technique for cutting or singulating a wafer into individual die includes mechanical cutting with a diamond cutting wheel. One technique for holding the wafer during cutting includes use of a circular metal ring which is larger than the wafer being cut. A thin film, commonly referred to as cutting film or tape, is tightly spread over and across the metal ring. One side of the tape is provided to be tacky while the opposing side is not. The tacky side is adhered to the ring. A surface of the wafer is substantially centrally positioned relative to the ring and adhered to the tacky side of the tape. With the wafer so adhered, the metal ring is positioned relative to a cutting device which orients the ring and cuts the wafers along designated scribe lines or street areas on the wafer, where circuitry has typically not been fabricated, for separating the wafer into individual die.

The cut individual die remain attached to the tape due to the stickiness of the tape. Vacuum-type pick-and-place devices then engage individual selected die to pull such from the tape for positioning onto lead frames or other devices for incorporation into finished product. Testing of the individual die for operability is typically conducted prior to the cutting operation.

SUMMARY OF THE INVENTION

In accordance with an aspect of the invention, a method of processing a semiconductive material wafer includes first cutting a cut at least partially into a semiconductive material wafer, with the cut having edges. An insulating material is formed over at least a portion of the edges within the cut. Second cutting within the cut and through the wafer is then conducted. Ideally, such forms individual die which have at least a portion of their individual side edges covered with insulating material.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Pat. Laws "to promote the progress of science and useful arts" (Article 1, Section 8).

Figure 1:
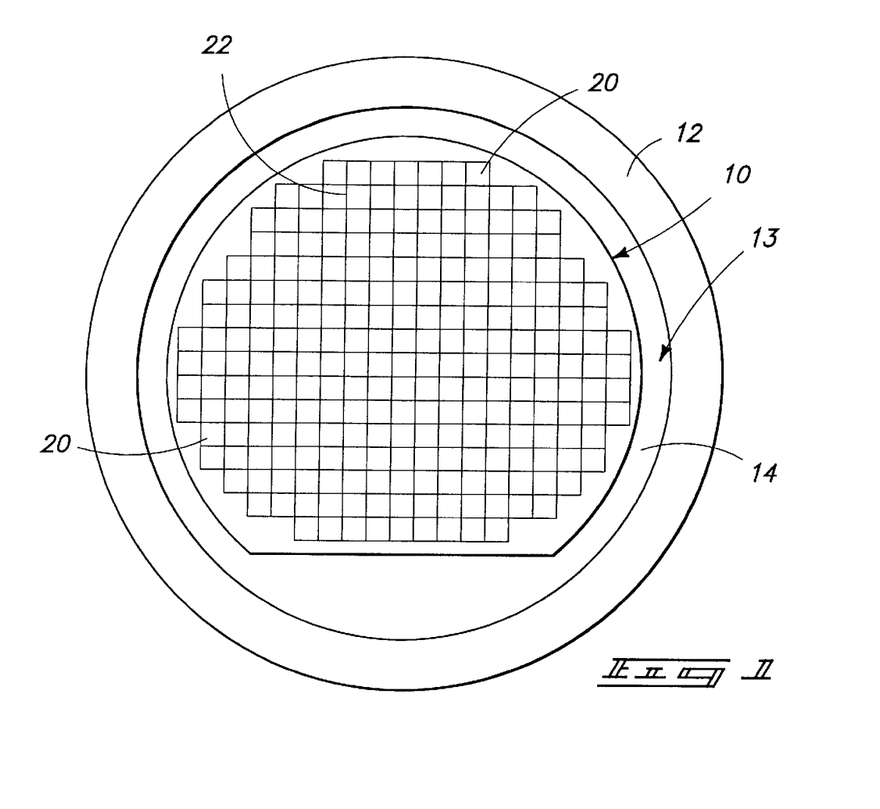
FIG. 1 is a top view of a semiconductor wafer at one processing step in accordance with the invention.
Figure 2:
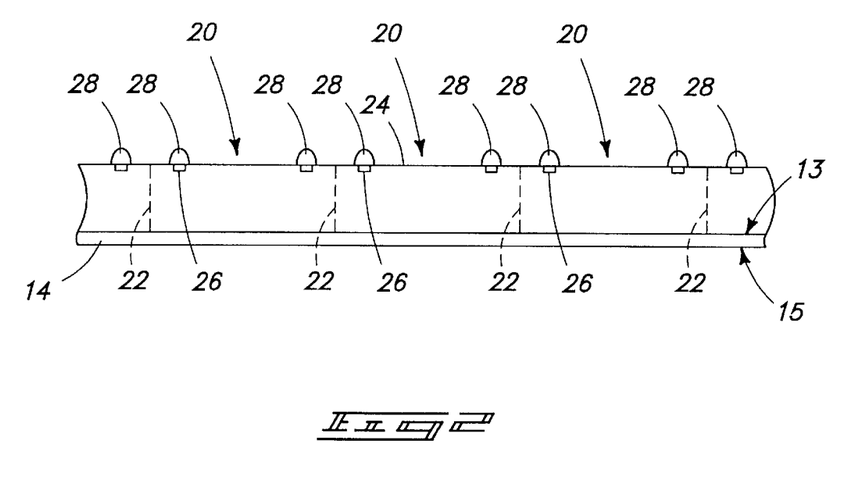
FIG. 2 is an enlarged sectional view of a portion of the FIG. 1 wafer at a processing step subsequent to that depicted by FIG. 1.

FIGS. 1 and 2 illustrate a semiconductor wafer 10 in process. A circular metal carrier or process ring 12 has an adhesive cutting film 14 stretched thereacross and adhered to the underside thereof. Adhesive film 14 has an adhesive side 13 which faces the reader and a non-adhesive side 15 on the opposite side thereof. An example tape or cutting film is Nitto Denko High Tack Tape V-8-5. Wafer 10 is centrally positioned or located onto tape or film 14 for cutting. FIG. 1 illustrates but one embodiment of how a wafer 10 can be configured for singulation into individual die.

Semiconductive material wafer 10 has been fabricated into discrete die areas 20 having integrated circuitry fabricated therewithin. Such inherently forms or defines street area or scribe lines 22 where circuitry has typically not been formed and where cutting will occur to achieve singulation into individual die. Wafer 10 typically comprises an outermost passivation layer defining an outer insulating surface 24. Bond pads 26 are exposed through the passivation layer for making electrical connection between the resultant chip and circuitry or components external of the chip. Accordingly, bond pads 26 are formed within die areas 20 and are proximately associated with wafer outer surface 24. Bond pads 26 typically are received inwardly 0.8 micron from outer surface 24.

In the illustrated embodiment, wafer 10 will be singulated into individual die constituting flip chips. Accordingly, bond pads 26 have conductive material 28 in the form of bumps formed thereover by any conventional bumping or other technique. An exemplary projection distance of the outermost portion of bumps 28 from surface 24 is from 4 to 6 mils.

Figure 3:
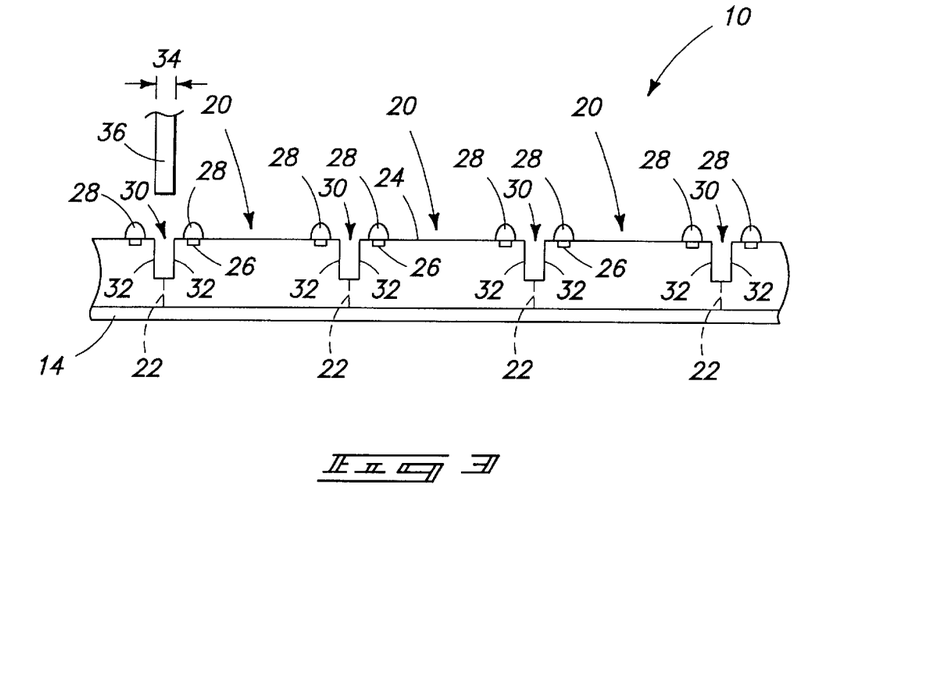
FIG. 3 is an enlarged sectional view of a portion of the FIG. 1 wafer at a processing step subsequent to that depicted by FIG. 2.
Figure 4:
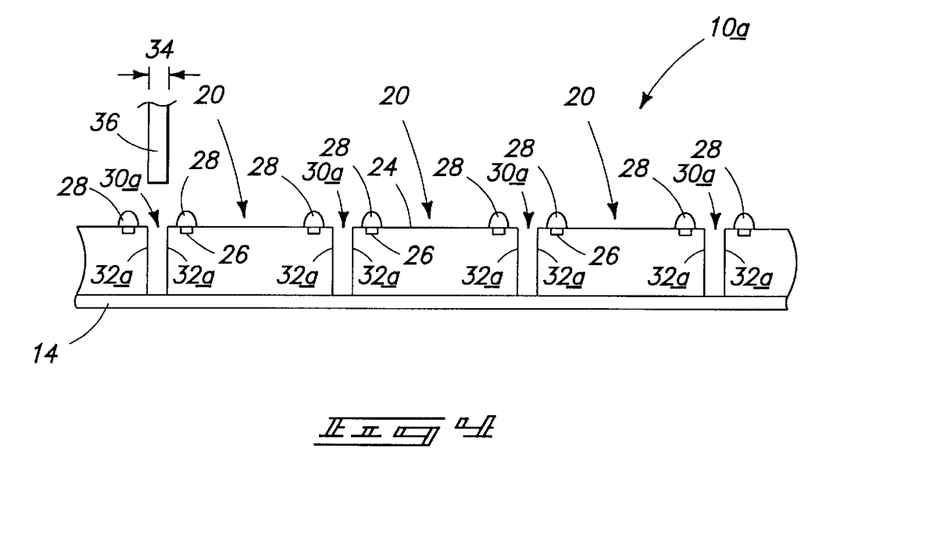
FIG. 4 is an enlarged sectional view of a portion of the FIG. 1 wafer at an alternate processing step subsequent to that depicted by FIG. 2 and corresponding in sequence to that of FIG. 3.
Figure 5:
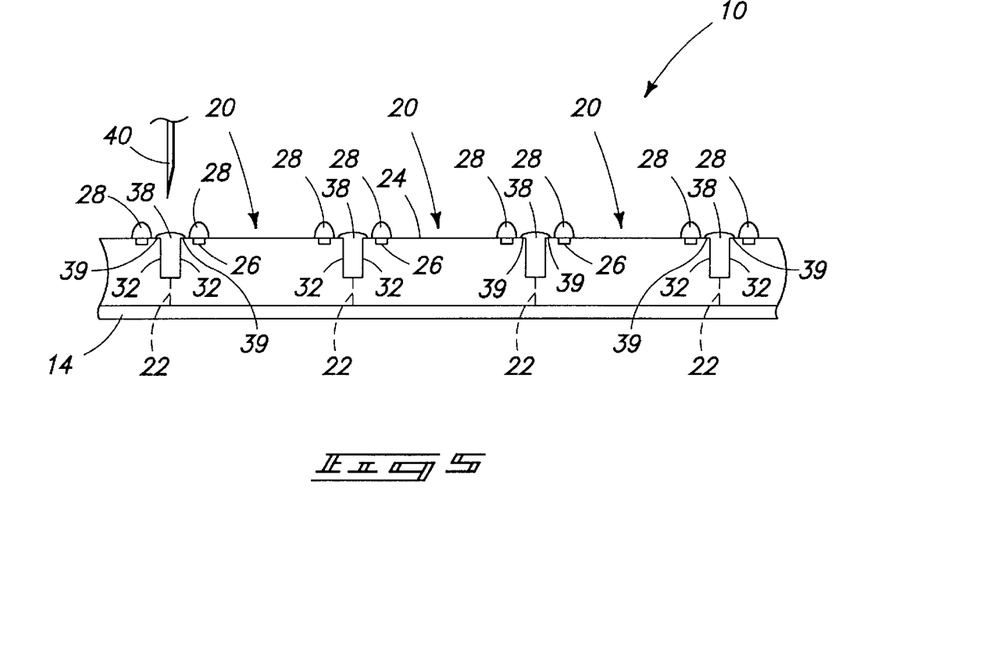
FIG. 5 is a view of the FIG. 3 wafer at a processing step subsequent to that depicted by FIG. 3.
Figure 6:
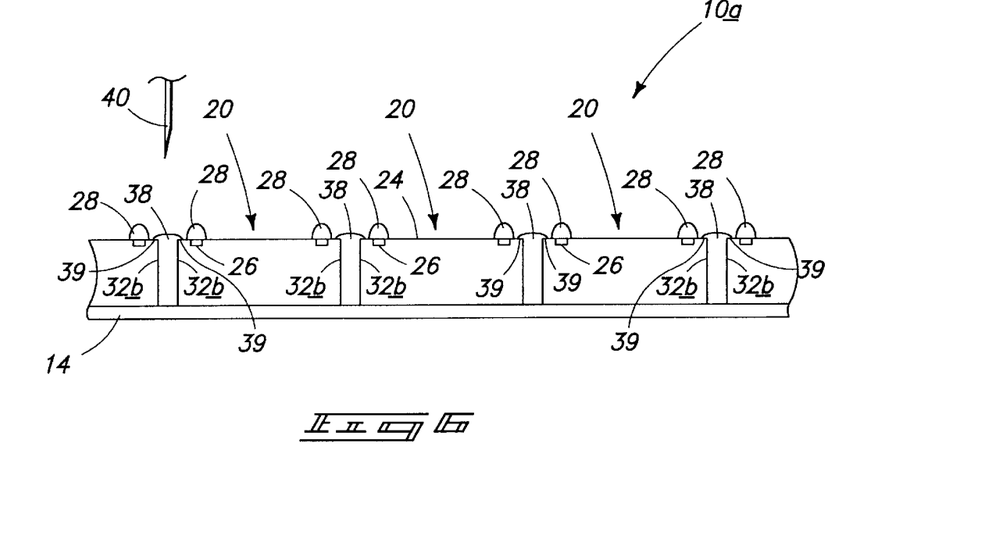
FIG. 6 is a view of the FIG. 4 wafer at an alternate processing step corresponding in sequence to that of FIG. 5.
Figure 7:
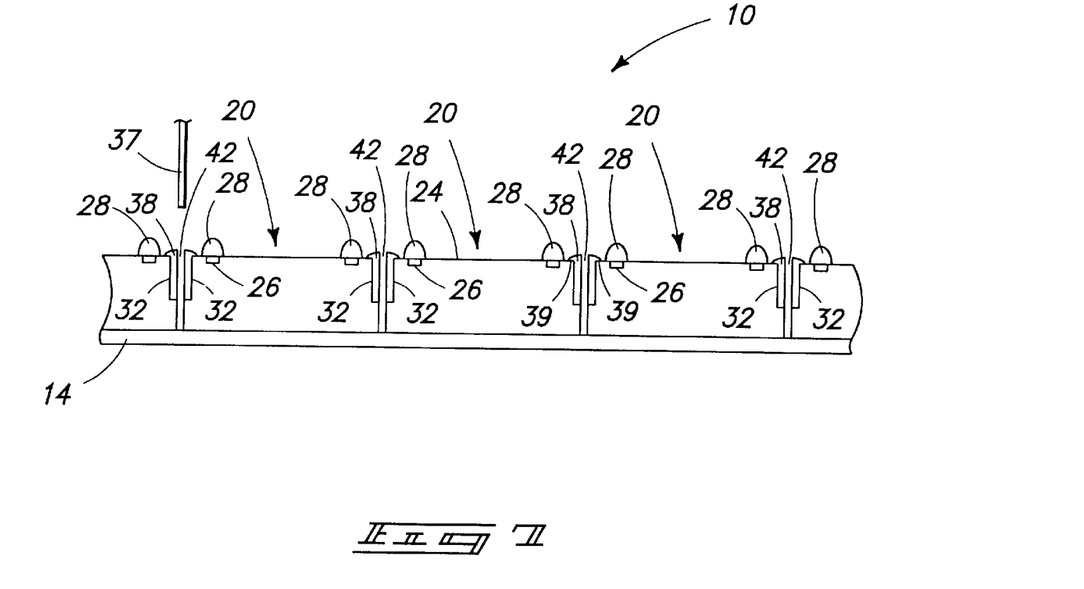
FIG. 7 is a view of the FIG. 3 wafer at a processing step subsequent to that depicted by FIG. 5.
Figure 8:
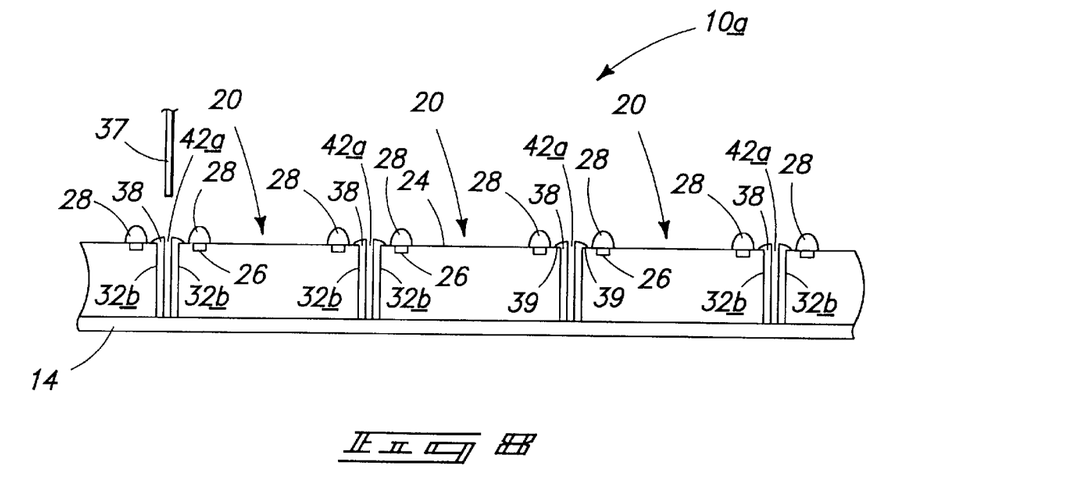
FIG. 8 is a view of the FIG. 4 wafer at a processing step subsequent to that depicted by FIG. 6 corresponding in sequence to that of FIG. 7.

The description proceeds with exemplary alternate processing of wafer 10, wherein FIGS. 3, 5 and 7 constitute but one processing sequence and FIGS. 4, 6, and 8 constitute an alternate processing sequence. Like numerals in the component numbering of the two series are utilized, with the suffix "a" or different numerals being utilized in the second FIGS. 4, 6 and 8 series to designate differences.

Referring to FIG. 3, first cutting of wafer 10 on film 14 is conducted through outer surface 24 about die areas 20 over scribe lines 22 and only partially into wafer 10 to form a series of die cuts 30. An exemplary depth for cuts 30 is less than or equal to about 50% of the wafer thickness. Such forms cut edges 32 extending from outer surface 24. An example method of cutting is mechanical sawing, such as using a saw blade 36, to provide die cuts 30 to have common first cut widths 34 corresponding to the thickness of saw blade 36. An example thickness 34 is 4 mils. Alternate techniques for forming cuts 30 could also be used, such as laser cutting or etching.

FIG. 4 illustrates one alternate processing wherein cuts 30a are formed entirely through wafer 10a, forming side edges 32a.

Referring to FIGS. 5 and 6, insulating material 38 is formed over at least a portion of edges 32/32a within cuts 30/30a. An example material is polyimide. As shown, such insulating material covers all of cut edges 32/32a within cuts 30/30a, and insulating material 38 completely fills and overfills cuts 30/30a. The overfilling also forms insulating material 38 over portions of die area outer surfaces 24, such as the illustrated portions 39. Thus, insulating material 38 is adhered to at least a portion of side edges 32/32a yet is not formed over bond pads 26. Insulating material 38 is accordingly ideally continuous in extension over those portions of side edges 32/32a to which it adheres and portion 39 of outer surface 24 to which it adheres. An exemplary distance for insulative material 38 to project from outer surface 24 is 0.5 mil. This is also ideally less than the distance which bumps 28 project to avoid any interference in subsequent bonding of the discrete flip chips to other substrates.

One method of forming or applying insulating material 38 is by ejection from a syringe, such as the illustrated syringe 40, into the respective cuts to totally fill such cuts with insulating material. Alternate techniques could of course be utilized, with but one such technique being described subsequently. With the syringe or other preferred techniques, the insulating material layer forming occurs while wafer 10 is adhered to adhesive cutting film 14.

Referring to FIGS. 7 and 8, another cutting is conducted into insulating material 38 within first cuts 30/30a and through the thickness of wafer 10 to form second cuts 42/42a. Second cuts 42/42a have different widths from the first cut widths, with the first cut widths preferably being at least three times as great as the second cut widths. As with the first described cutting, an example technique is mechanical sawing using a second saw blade 37 of different thickness than the first saw blade, with an example being 1.2 mils. Accordingly in such embodiment, all of the cutting and forming of insulating material occurs while wafer 10 is adhered to a single adhesive cutting film 14. In the FIG. 7 embodiment, the second cutting also cuts through semiconductive material of wafer 10 through the bases of first cuts 30/30a. In FIG. 8 where first cuts 30a extend entirely through wafer 10 and the second cut is to a second thinner width than first cut in between edges 32a, such second cutting does not cut through any semiconductive material of wafer 10.

The second cuts preferably leave a thickness of insulating material 38 over cut edges 32/32a of between about 100 Angstroms and 100 microns. More preferably, such thickness is between about 10 microns and 100 microns, with 25 microns being a specific example. Accordingly, such insulating material 38 is provided to be adhered over only a portion of outer insulating surface 24 and adhered to at least a portion of side edges 32/32a, and preferably over all of such side edges.

Figure 9:
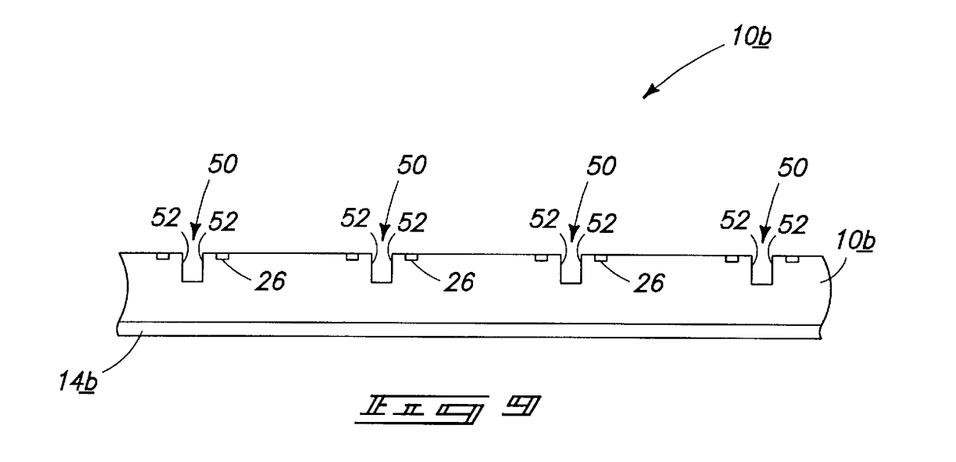
FIG. 9 is a sectional view of an alternate embodiment semiconductor wafer fragment processed in accordance with alternate aspects of the invention.

Alternate exemplary processing is described with reference to FIGS. 9–11. Like numerals from the first described embodiments are utilized where appropriate, with the differences being indicated by the suffix "b", or with different numerals. Referring to FIG. 9, a wafer 10b is adhered to an adhesive film carrier 14b for cutting. Wafer 10b and film 14b can be the same as that described with respect to the first embodiments. Cuts 50, preferably corresponding to those of cuts 30a of the first embodiments, are formed partially into wafer 10b. Such form cut side edges 52.

Figure 10:
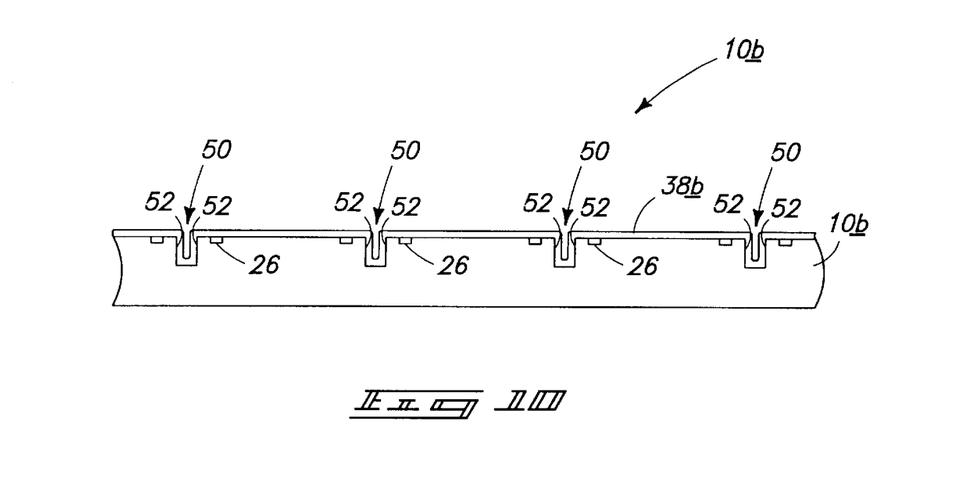
FIG. 10 is a view of the FIG. 9 wafer at a processing step subsequent to that depicted by FIG. 9.

Referring to FIG. 10, wafer 10b is removed from adhesive film 14b. An insulative material 38b is then deposited over outer surface 24 of wafer 10b and to within cuts 50 to at least partially cover cut edges 52 and to only partially fill such cuts with insulative material. Thus in this particular embodiment, formation of an insulating material over at least a portion of the cut edges occurs while the wafer is not adhered to any adhesive cutting film.

Figure 11:
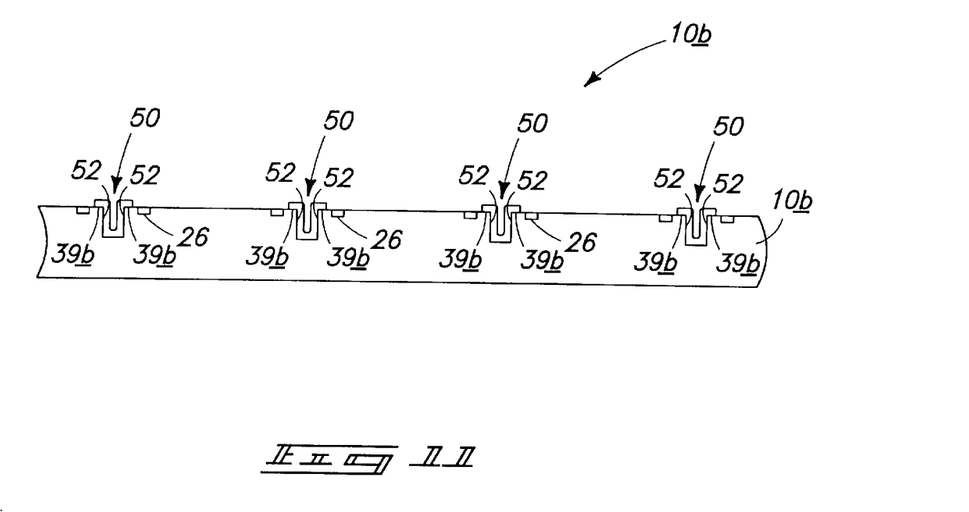
FIG. 11 is a view of the FIG. 9 wafer at a processing step subsequent to that depicted by FIG. 10.

Referring to FIG. 11, insulative material 38b is removed from being received over bond pads 26 while leaving insulative material within die cuts 50. Ideally as shown, the removing leaves some insulating material 38b over die area outer surfaces 24, such as portions of 39b as shown. A preferred method for producing the FIG. 11 removal is by photopatterning and etching. A polishing process might also be utilized, but would most likely not in such instance leave any insulating material remaining over die area outer surfaces 24.

Figure 12:
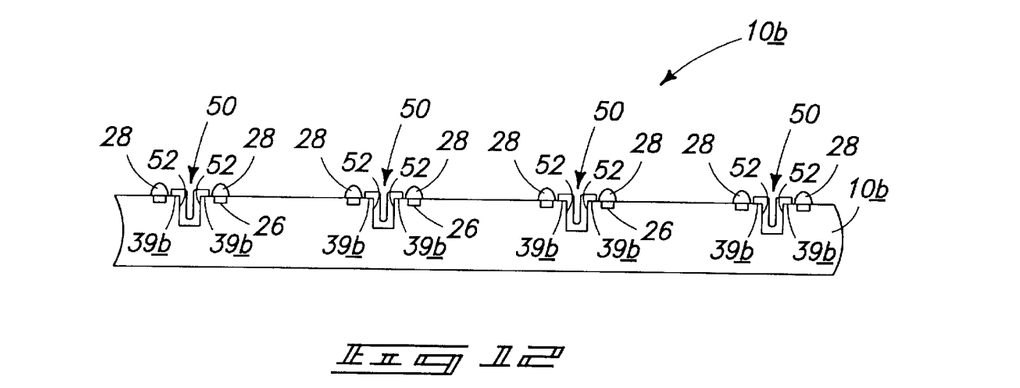
FIG. 12 is a view of the FIG. 9 wafer at a processing step subsequent to that depicted by FIG. 11.

Referring to FIG. 12, the FIG. 11 wafer has been bumped with conductive material as in the first described embodiment for the exemplary ultimate forming of flip chips.

Figure 13:
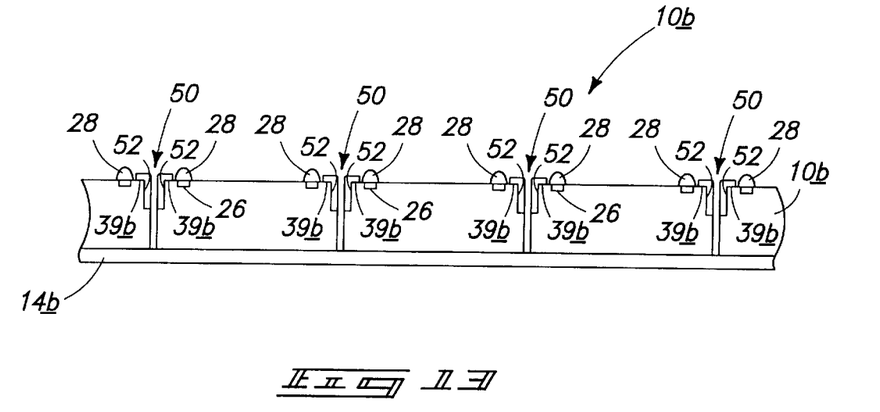
FIG. 13 is a view of the FIG. 9 wafer at a processing step subsequent to that depicted by FIG. 12.

Referring to FIG. 13, wafer 10b is again adhered to another or same adhesive cutting film 14b. Thereafter, cutting is conducted into and through insulative material 38b within die cuts 50 and through wafer 10b. Again, the preferred cutting methods are to utilize two saws of different thicknesses, with the first cut being at least three times as wide as the second.

Figure 14:
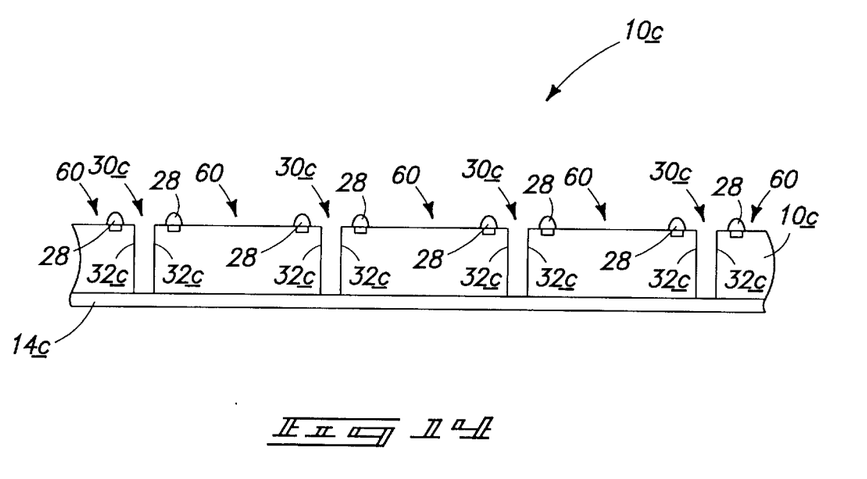
FIG. 14 is a sectional view of yet another alternate embodiment wafer fragment at another alternate processing step in accordance with the invention.

Yet another alternate embodiment is described with reference to FIGS. 14–15. Like numerals from the first described embodiments are utilized where appropriate, with differences being indicated by the suffix "c" or with different numerals. A wafer 10c is adhered to a stretchable adhesive cutting film 14c. Many cutting films, such as the Nitto Denko High Tack Tape V-8-5 example tape, are stretchable. Wafer 10c is subjected to cutting on film 14c into spaced individual die 60 having cuts 30c, with cut edges 32c, formed therebetween. The cuts to form 30c can desirably be conducted with a thinner blade than that described with respect to the other embodiments, such as for example with a desired finish cutting thickness blade of 1.2 mils. Such will provide a first average spacing of cuts 30c which can be the same, or even less than, the final cut.

Figure 15:
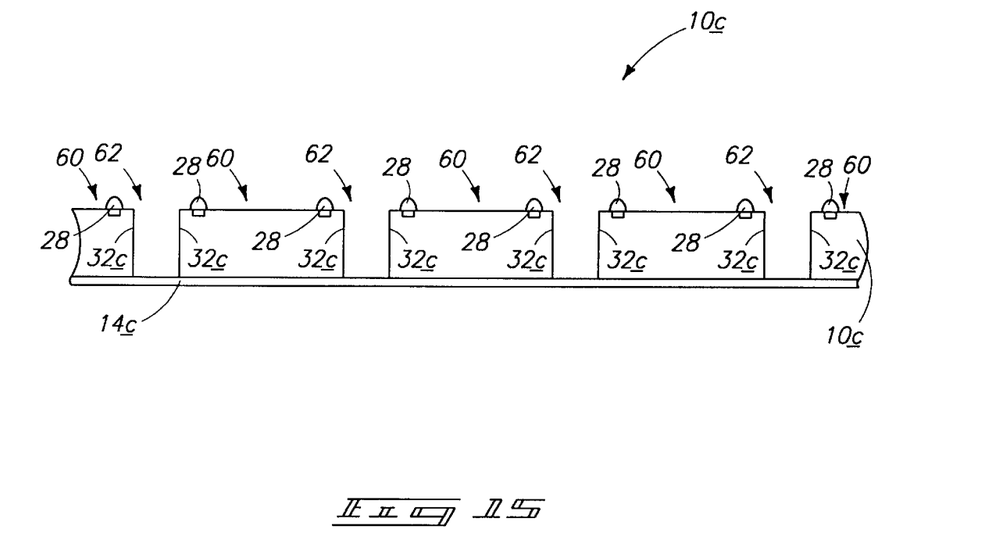
FIG. 15 is a view of the FIG. 14 wafer at a processing step subsequent to that shown by FIG. 14.

Referring to FIG. 15, adhesive film 14c is stretched to space the illustrated die further apart from one another to a second average spacing 62 which is greater than the spacing provided by cuts 30c. The second spacing relationship relative to the first spacing relationship is analogous with that described with respect to the above embodiments.

Namely, the spacing in FIG. 15 is preferably at least three times as great as the desired finish cut width.

Processing would continue for example as described with respect to the previous embodiments, whereby second spaces 62 would be at least partially filled with insulative material effective to cover at least some portion of cut die edges 32c. Subsequently, cutting would be conducted into and through such formed insulating material between adjacent die to form singulated die on film 14c. This final cutting could utilize a saw the same width as the saw used for the FIG. 14 cutting, or utilizing a saw of a different width.

It is recognized that native oxide forms on the edges of chips or die of the prior art. However, such is understood to be to a thickness of no greater than 20 Angstroms, and certainly well less than the lower 100 Angstroms limitation in some of the accompanying claims.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A method of processing a semiconductive material wafer comprising:
   first cutting a cut at least partially into an uncut semiconductive material wafer, the cut having edges;
   forming insulating material over at least a portion of the edges within the cut; and
   second cutting within the cut and through the wafer.

2. The method of claim 1 wherein the first cutting forms the cut entirely through the wafer.

3. The method of claim 1 wherein the first cutting does not form the cut entirely through the wafer.

4. The method of claim 1 wherein the first cutting forms the cut to less than or equal to about 50% through the wafer.

5. The method of claim 1 wherein the forming comprises forming the insulating material over all of the cut edges within the cut.

6. The method of claim 1 wherein the first cutting occurs through an outer surface of the wafer, the forming also comprising forming the insulating material over at least a portion of the wafer outer surface.

7. The method of claim 1 wherein the first and second cutting form respective cuts of different widths.

8. The method of claim 1 wherein the first and second cuttings comprise mechanical sawing using at least two saw blades of different thicknesses.

9. The method of claim 1 wherein the first and second cuttings occur while the wafer is adhered to an adhesive cutting film, the forming occurring while the wafer is adhered to an adhesive cutting film.

10. The method of claim 1 wherein the first and second cuttings occur while the wafer is adhered to a single adhesive cutting film, the forming occurring while the wafer is adhered to the single adhesive cutting film.

11. The method of claim 1 wherein the first and second cuttings occur while the wafer is adhered to an adhesive cutting film, the forming occurring while the wafer is not adhered to any adhesive cutting film.

12. A method of processing a semiconductive material wafer comprising:
    cutting at least partially into an uncut semiconductive material wafer to form a first cut having a first width, the first cut having edges;
    at least partially filling the first cut with insulating material effective to cover the cut edges; and
    cutting into the insulating material within the first cut and through the wafer to form a second cut having a second width which is less than the first width.

13. The method of claim 12 wherein the filling comprises totally filling the cut.

14. The method of claim 12 wherein the filling comprises only partially filling the cut.

15. The method of claim 12 wherein the filling comprises ejecting insulating material from a syringe into the cut.

16. The method of claim 12 wherein the first cut is formed entirely through the wafer, the cutting to form the second cut not cutting through any semiconductive material.

17. The method of claim 12 wherein the cuttings to form the first and second cuts comprise mechanical sawing using at least two saw blades of different thicknesses.

18. The method of claim 12 wherein the first width is at least three times as great as the second width.

19. A method of forming flip chips comprising:
    providing a semiconductive material wafer having integrated circuitry fabricated within discrete die areas on the wafer, the discrete die areas having bond pads formed therewithin, the discrete die areas having respective outer surfaces;
    positioning the wafer onto a film for cutting;
    first cutting at least partially into the wafer on the film about the die areas to form a series of die cuts, the cuts having edges, the wafer being uncut prior to the first cutting;
    after the first cutting, forming an insulating material over at least a portion of the edges within the die cuts and over at least a portion of the respective die area outer surfaces; and
    second cutting within the die cuts and through the wafer.

20. The method of claim 19 comprising bumping the bond pads with conductive material prior to the first cutting.

21. The method of claim 19 comprising bumping the bond pads with conductive material, the bumped bond pads having conductive material projecting from the die areas to a greater distance than the insulating material projects.

22. The method of claim 19 wherein the forming occurs while the wafer is on the film.

23. The method of claim 19 wherein the first cutting forms the die cuts entirely through the wafer.

24. The method of claim 19 wherein the forming comprises ejecting insulating material from a syringe into the die cuts.

25. A method of processing a semiconductive material wafer comprising:
    providing a semiconductive material wafer having integrated circuitry fabricated within discrete die areas on the wafer, the discrete die areas having bond pads formed therewithin;
    cutting at least partially into the semiconductive material wafer about the die areas to form a series of die cuts, the cuts having edges;
    depositing an insulative material over the wafer and to within the cuts to at least partially cover the cut edges and to at least partially fill the cuts with the insulative material;
    removing the insulative material from being received over the bond pads and leaving the insulative material within the die cuts; and after the removing, cutting into and through the insulative material within the die cuts and through the wafer.

26. The method of claim 25 wherein the insulative material comprises polyimide.

27. The method of claim 25 wherein the die cuts are formed entirely through the wafer, the cutting into and through the insulating material within the die cuts not cutting through any semiconductive material.

28. The method of claim 25 wherein the discrete die areas comprise outer surfaces over which the insulative material is deposited, the removing leaving some insulative material over the die area outer surfaces.

29. The method of claim 25 wherein the removing comprises photopatterning and etching.

30. The method of claim 25 wherein the cuttings occur while the wafer is adhered to an adhesive cutting film, the depositing and removing occurring while the wafer is not adhered to any adhesive cutting film.

31. A method of processing a semiconductive material wafer comprising:

positioning a semiconductive wafer onto a stretchable film for cutting said wafer into individual die;

cutting the wafer on the film into at least some spaced individual die, the individual die having cut edges, at least some of the die being spaced from immediately adjacent die at a first average spacing;

stretching the film to space said some die from immediately adjacent die to a second average spacing which is greater than the first average spacing;

after the stretching, at least partially filling the second average spacing with insulative material effective to cover at least some of the cut die edges; and cutting into and through the insulating material between adjacent die to form singulated die on the film.

32. The method of claim 31 wherein the cuttings form respective cuts having the same width.

33. The method of claim 31 wherein the cuttings form respective cuts having different widths.

34. The method of claim 31 wherein the second spacing is at least three times as great as the first spacing.

35. The method of claim 31 wherein the filling comprises ejecting insulating material from a syringe into the cut.

* * * * *